United States Patent [19]

Jacobsen

[11] 4,323,841

[45] Apr. 6, 1982

[54] INDICATING DEVICE FOR USE IN AIRFIELD LIGHTING PLANTS TECHNICAL FIELD

[75] Inventor: Leif V. Jacobsen, Copenhagen, Denmark

[73] Assignees: Christian Gundorph Albertus, Naerum; Erik Steinmann Hansen, Soborg; Leif Heegaard Giortz, Copenhagen, all of Denmark

[21] Appl. No.: 136,353

[22] Filed: Apr. 1, 1980

[30] Foreign Application Priority Data

Apr. 4, 1979 [DK] Denmark .............................. 1382/79

[51] Int. Cl.³ ...................... G01R 31/02; G08B 21/00
[52] U.S. Cl. .................................... 324/51; 315/130; 324/111; 340/652
[58] Field of Search ....................... 324/51, 99 D, 111; 340/635, 642, 652, 654, 655, 656; 315/130

[56] References Cited

U.S. PATENT DOCUMENTS 3,054,991 9/1962 Howell .............................. 340/642
3,061,828 10/1962 Hauck ............................... 340/642

FOREIGN PATENT DOCUMENTS 1379077 1/1975 United Kingdom .

*Primary Examiner*—Ernest F. Karlsen
*Attorney, Agent, or Firm*—Pennie & Edmonds

[57] ABSTRACT

An indicating device for use in a plant for supplying electric current from an alternating current source to a loop circuit having a plurality of serially interconnected primary circuits of a number n of current transformers coupled to an airfield lighting lamp, comprises a transformer coupled to the alternating current source to generate a voltage signal representative of the voltage supplied to the loop circuit, a transformer coupled to the loop circuit to generate a current signal representative of the current flowing in the loop circuit, and an electronic circuit capable of generating in response to the voltage and current signals an output voltage indicative of the number of primary circuits of the loading transformers being uncoupled to their respective secondary circuits. The output voltage is proportional to the voltage integral.

$$\int_{t_o}^{T} u\, dt$$

of the loop supply voltage u from the time $t_o$ when the loop current i in each half period passes the zero value and to the time T when the loop current i attains a value corresponding to the saturation current $i_M$ for the current transformers. Preferably, a compensation voltage representative of the value of the voltage integral in case none of the current transformers has an unloaded secondary circuit is subtracted from the output voltage so as to obtain a final voltage signal which can be passed on to a meter precalibrated to indicate the number of uncoupled secondary units.

14 Claims, 5 Drawing Figures

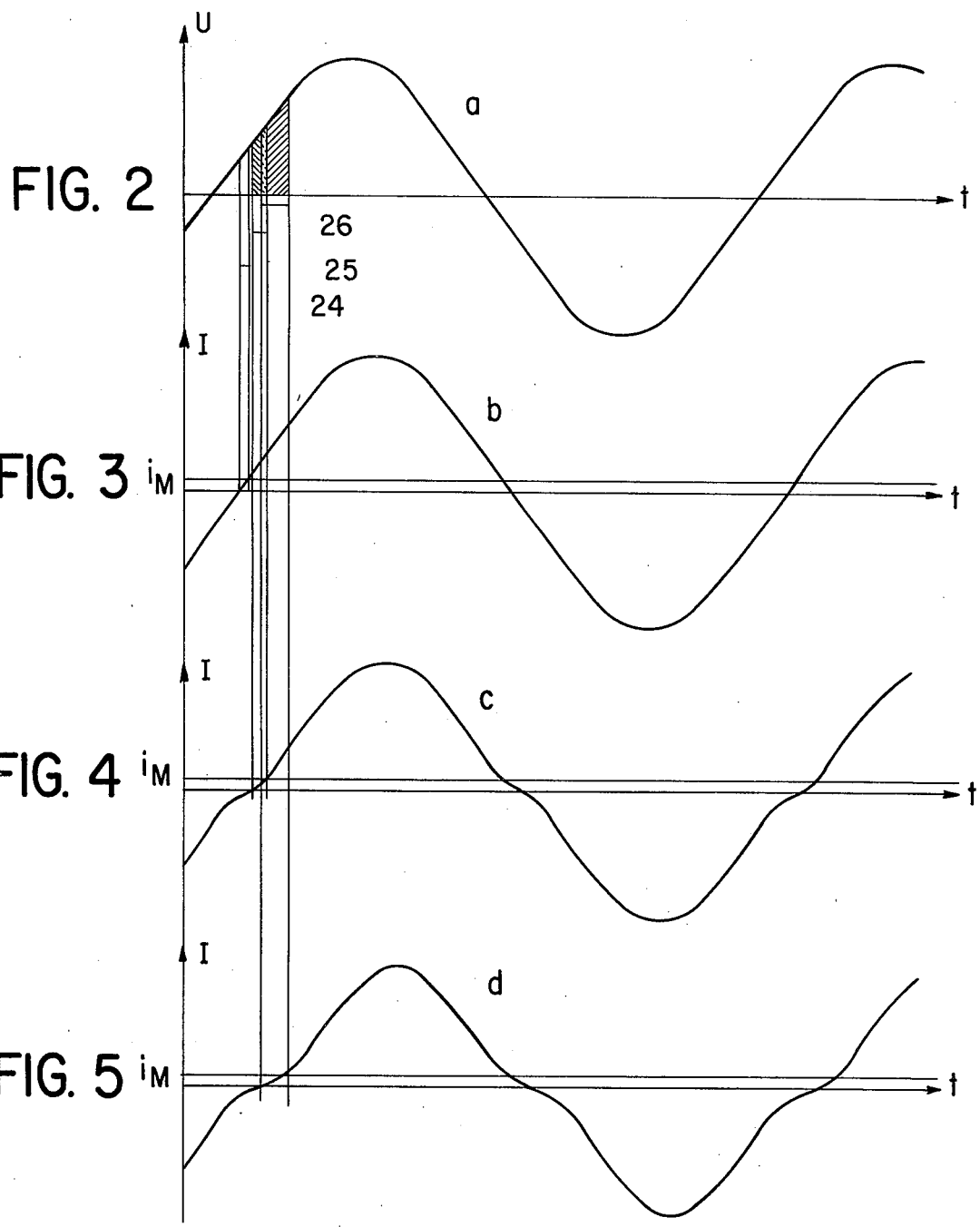

INDICATING DEVICE FOR USE IN AIRFIELD LIGHTING PLANTS TECHNICAL FIELD

TECHNICAL FIELD

This invention relates to devices for detecting variation in the loading of a circuit coupled to an alternating source. In particular, this invention relates to an indicating device for use in a plant for supplying electric current from an alternating current source to a loop circuit comprising serially interconnected primary circuits of a number n of current transformers so as to indicate the number m<n of those current transformers which at a given time may have unloaded secondary circuits.

BACKGROUND ART

In systems wherein a loop circuit includes a number of loading elements, it is desirable to ascertain the number of loading elements which are in an open circuit condition. For this reason, indicating devices are employed to determine and display the number of open circuit loading elements. One such example of loading elements is a current transformer in which the secondary circuit of each current transformer is loaded with an electric incandescent lamp. Preferably, these lamps may serve in airfield lighting plants to illuminate runways, approaches etc.

Other examples of plants in which indicating devices may advantageously be employed include road lighting plants and plants serving to prevent railroad switches from being blocked up by snow by means of melting the snow. In the latter case, a number of rail switches are each equipped with electric heating units, each coupled to a secondary circuit of a current transformer.

With respect to airfield lighting plants, if m of the n lamps at a given moment are not alight this indicates that there must be a break somewhere in the secondary circuit of the respective transformer or transformers, i.e., these transformers are unloaded, and in most cases because of the lamp or lamps being burned out.

In preferred airfield lighting plants, the lamps are interconnected in series, but by means of individual current transformers. Notwithstanding the series connection, only the deficient lamps will not be alight.

Nevertheless, it is undesirable when in an airfield lighting plant there are lamps which are not alight. It is evident that it is not as undesirable if only a low percentage of the lamps fail. But if, e.g., 10% of the lamps fail it may be troublesome, and if the percentage is as high as, e.g., 20% it may be disastrous. In that instance, the pilots may have difficulty in getting an idea of the lie of the land, particularly during landing operations under low visibility conditions.

It has therefore been found desirable to maintain vigilance on the number of deficient lamps in such a plant by means of a suitable indicating device serving that purpose. Such device should preferably be designed for remote monitoring of the operational state of the lamps and might advantageously be installed with the maintenance staff of the airfield who would have to replace burned-out lamps in due time.

Such an indicating device has in fact been developed. One such device is disclosed in British Pat. No. 1,379,077. Therein the known device is operable in dependence upon the phase difference between the loop current and the loop supply voltage. However, the output signal produced in the known device is only a true indication of the number m of unloaded current transformers as long as the curve form of the loop supply voltage u does not change and as long as the loop current i is kept constant.

These facts render the known indicating device less applicable for use in connection with plants equipped with an alternating current source of a type yielding a current having a curve form differing from that for which the indicating device is designed, and in connection with plants equipped with an alternating current source having known first means for automatically keeping the yielded current constant at a fixed value irrespective of the number of current transformers being unloaded and having known second means for manually changing the fixed value for the constant loop current. Such change is required when the weather conditions, with respect to visibility changes, makes it desirable to change the luminous intensity of the lamps accordingly by manually increasing or decreasing the fixed constant value, as the case may be.

In the known indicating device a change in curve form and/or in the fixed value for the constant loop current will change the factor of proportionality expressing how the phase difference between the loop current and the loop supply voltage varies with changes in the number of current transformers being unloaded. Hence, the reduced reliability of the known indicating device is evident.

I have invented an improved indicating device and method of operating same which successfully avoids the above-mentioned disadvantages and limitations of known prior art devices. In particular, the indication device according to the present invention does not suffer from the inconveniences mentioned above and the output signal it produces is not determined by the phase difference between the loop current i and the loop supply voltage u.

DISCLOSURE OF INVENTION

A device for detecting variation in the loading of a circuit coupled to an alternating current source, the circuit being loaded by a plurality of serially interconnected primary circuits of a like plurality of loading transformers having a like plurality of secondary circuits, each secondary circuit a like plurality of loading transformers having a like plurality of secondary circuits, each secondary circuit being coupled to a respective primary circuit, comprises current signal means for generating a current signal representative of the current flowing in the loaded circuit, voltage signal means for generating a voltage signal representative of the voltage supplied to the loaded circuit, detection means responsive to the current signal and the voltage signal for generating an output voltage signal proportional to the integration of the voltage supplied to the loaded circuit, said integration being from a first predetermined time corresponding to a first circuit current value of approximately zero and a second predetermined time corresponding to a second circuit current value approximately equal to the saturation current for the loading transformers, the output voltage signal being indicative of the number of primary circuits of the loading transformers being uncoupled to their respective secondary circuits.

The detection means is an electronic circuit comprising first low pass filter means coupled to the voltage signal means for generating a first generally noise-free signal, and first rectifier means for rectifying the first noise-free signal so as to generate a first rectified signal representative of the voltage supplied to the loaded circuit. The electronic circuit further comprises resistance means coupled to the current signal means for generating a voltage signal corresponding to the current flowing in the circuit, second low pass filter means coupled to the resistance means for generating a second generally noise-free signal, and second rectifier means for rectifying said second noise-free signal so as to generate a second rectified signal representative of the current flowing in the loaded circuit. The electronic circuit further comprises logic circuit means for receiving the second rectified signal and for generating a control signal. The control signal has a first state value when the current flowing in the loop circuit is increasing in magnitude and exceeds a current value of zero, and the control signal has a second state value when the current flowing in the loop circuit exceeds the saturation value. Also, the electronic circuit comprises integration means for receiving the first rectified signal and for receiving the control signal so as to integrate the first rectified signal during the time interval occurring between the first state and the second state value of the control signal and to generate an integrated output signal. A compensating means is provided for receiving the integrated output signal and generating a compensation signal so as to generate a final output voltage signal being indicative of the number of primary circuits of the loading transformers being uncoupled to their respective secondary circuits. Indicating means can be provided such as a voltage meter and preferably one which is precalibrated for receiving the final output signal and providing a numerical display of the number of uncoupled primary circuits.

In contrast to known devices, the indicating device according to the invention is characteristic in that the electronic circuit thereof comprises means capable of making the said electric signal proportional to the voltage integral $$\int_{t_o}^{T} u\, dt$$

of the loop supply voltage u from the time $t_o$ when the loop current i in each half period passes the zerovalue and to the time T when the loop current i attains a value corresponding to the saturation current $i_M$ for the current transformers, means for producing and subtracting from the said electric signal a constant compensation voltage representing the value of said voltage integral in case none of the current transformers has unloaded secondary circuits, so as to obtain a final voltage signal to be passed on to an indicator proper.

In practice, the compensation voltage preferably is once and for all adjusted such that the pointer of the indicator proper will rest at zero when provision is made that none of the current transformers is unloaded.

The present invention is also directed to a method for detecting variation in the loading of a circuit coupled to an alternating current source, the circuit being loaded by a plurality of serially interconnected primary circuits of a like plurality of loading transformers having a like plurality of secondary circuits, each secondary circuit being coupled to a respective primary circuit, comprising generating a current signal representative of the current flowing in the loaded circuit, generating a voltage signal representative of the voltage supplied to the loaded circuit, generating an output voltage signal in response to the current signal and the voltage signal, the output voltage signal being proportional to the integration of the voltage supplied to the loaded circuit, said integration being from a first predetermined time corresponding to a first circuit current value of approximately zero and a second predetermined time corresponding to a second circuit current value approximately equal to the saturation current for the loading transformers, the output voltage signal being indicative of the variation in the loading of the circuit.

BRIEF DESCRIPTION OF THE DRAWINGS

An exemplary embodiment of an indicating device according to the present invention is described in detail below with reference to the drawings, wherein:

FIG. 2 is a graphic display of a supply voltage applied to a loop circuit having n serially connected loads and illustrating amplitude as a function of time.

FIG. 3 is a graphic display of a current flowing in the loop circuit in accordance with the supply voltage of FIG. 2 illustrating amplitude as a function of time.

FIG. 4 is a graphic display of the current of FIG. 3 when m of the n loads are uncoupled.

FIG. 5 is a graphic display of the current of FIG. 3 when 2m of the n loads are uncoupled.

BEST MODE FOR CARRYING OUT THE INVENTION

Figure 1:
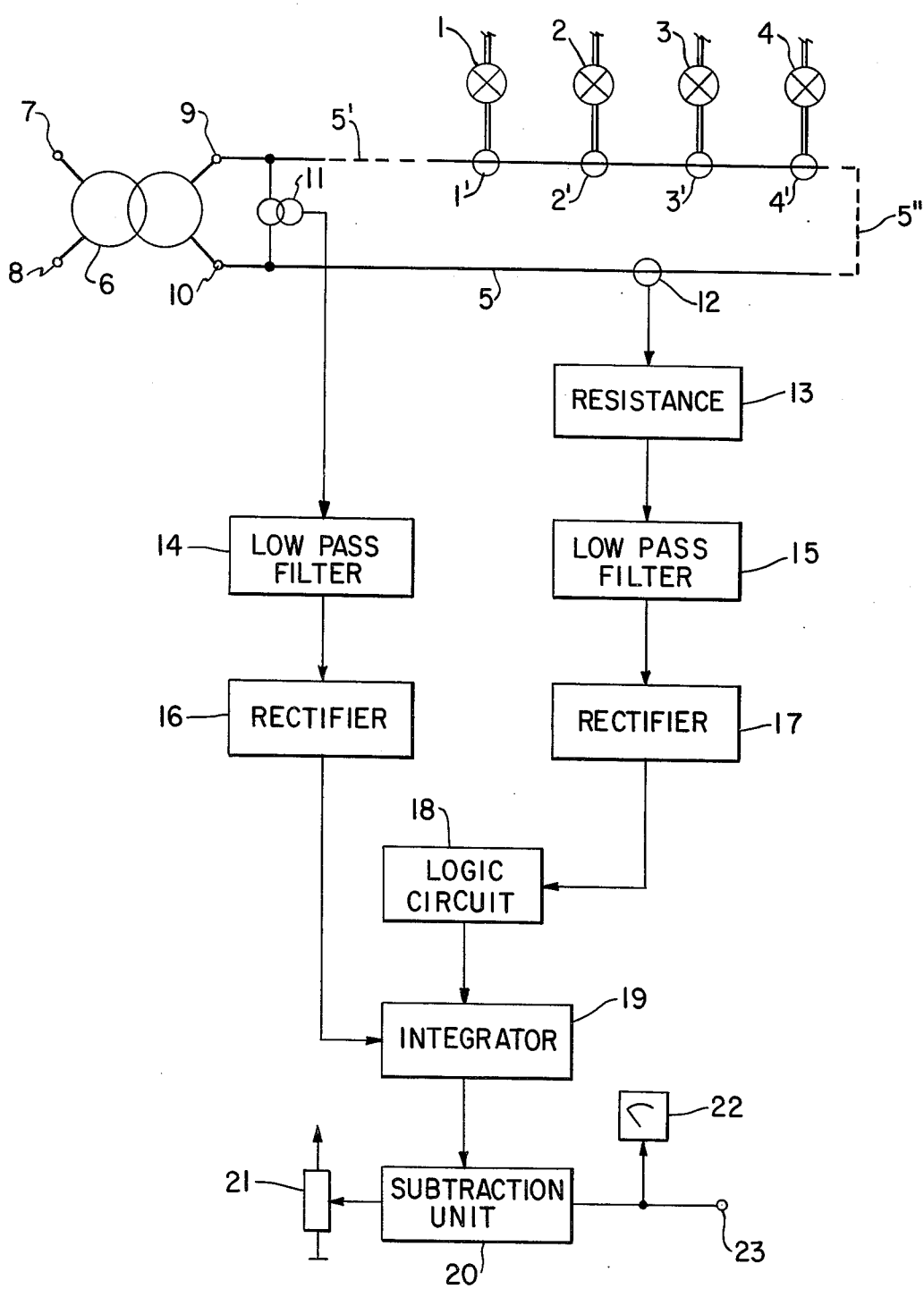
FIG. 1 is a partially block and partially schematic circuit diagram of an indicating device according to the present invention illustrated in use with an airfield light plant.

Referring to FIG. 1, a circuit diagram is illustrated as having four lamps 1, 2, 3, 4 which by means of current transformers 1', 2', 3', and 4', respectively, are coupled to a loop circuit 5. Also, an alternating current source 6 in the form of a transformer is coupled to the loop circuit 5 for supplying an electric current to the current transformers 1', 2', 3', and 4'. The loop circuit 5 is not limited as to the number of current transformers which can be employed, i.e., any number n can be used of which only those mentioned above, i.e., 1, 2, 3 and 4 are shown. The portions of loop circuit 5 in which the (n−4) lamps can be inserted by means of their respective current transformers are shown as dotted lines and marked as 5' and 5''.

The alternating current (AC) source 6 has output terminals 9 and 10 to which loop circuit 5 is coupled and across which a loop voltage u is supplied. The AC source 6 also has input terminals 7 and 8 for connection to a main AC supply by known means (not shown) for automatically keeping the loop current i flowing in the loop circuit at a constant fixed value irrespective of changes in the impedance of said loop circuit.

Between the main AC supply and terminals 7 and 8, known means (not shown) can be further provided for manually effecting a stepwise change in the fixed value of the current. This in turn permits changing the luminous intensity of the lamps 1, 2, 3, 4, . . . n in accordance with changing visibility conditions or requests from the pilots.

As shown in FIG. 1, a voltage transformer 11, e.g., an instrument transformer, is coupled across the output terminals 9 and 10. Its secondary voltage is proportional to the supply voltage u across the output terminals 9 and 10 of the AC source 6 and moreover represents the supply voltage u in the voltage integral $$\int_{t_o}^{T} u\,dt$$

in the electronic circuit to be described in detail below.

A current transformer 12, e.g., an instrument transformer, is also provided having its primary circuit inserted in the loop circuit 5 such that it is serially connected to the primary circuits of the n lamp transformers. When a suitable ohmic resistance bridges the secondary circuit of current transformer 12, the voltage across that resistance will be proportional to the current i flowing in the loop circuit 5. Also, that voltage contributes to calculating the voltage integral $$\int_{t_o}^{T} u\,dt.$$

Referring to FIGS. 2–5, containing the curves a, b, c, and d, respectively, each curve is drawn in its own system of co-ordinates wherein the abscissa axis in each case represents a sequence of time t calculated from a common time t equal to zero.

In FIG. 2, the ordinate axis of curve a represents the loop supply voltage u as a function of time, i.e., $u=u(t)$, measured in volts. In FIGS. 3–5, the ordinate axes in each of curves b, c, and d represent the loop current i as a function of time, i.e., $i=i(t)$, measured in amps under the below described operational conditions.

In particular, curve b illustrates the loop current i variation when all the lamps n are alight; curve c when a certain number m of the lamps are not alight; and curve d when double the number m of lamps, i.e., 2m, are not alight.

In view of the above, it is evidently clear that curve a is a graphic representation of the voltage output u from transformer 11 and that curves b, c, and d are representations of the current i from transformer 12.

The theoretical basis of the indicating device according to the present invention is hereafter set forth.

The instantaneous value of the voltage u (t) can be obtained from the following differential equation:

$$u = -L\,di/dt + Ri + \int C\,idt \quad (1)$$

wherein i is the instantaneous loop current, t is the time, L the total instantaneous inductance, R the total ohmic resistance in the loop (the ohmic resistance of the lamps being included in the ohmic resistance of the primary circuit of the current transformer and therefore the loop 5), and C is the total capacitance between terminals 9 and 10.

In differential equation (1), the second and the third terms (Ri and $$\int C\,idt$$

respectively) are negligible

Therefore, equation (1) can be simplified so as to read:

$$u = -L\,di/dt \text{ or,} \quad (2)$$

$$udt = -L\,di \text{ or,} \quad (3)$$

$$\int udt = -\int L\,di \quad (4)$$

If $L_1, L_2, L_3 \ldots L_n$ are each the individual self-induction of the respective n current transformers, equation (4) can be rewritten as follows:

$$\int udt = -\int L_1 di - \int L_2 di - \int L_3 di \ldots - \int L_n di \quad (5)$$

Since all n current transformers in the loop 5 are assumed to be identical and inasmuch as their primary circuits are interconnected in series in the loop 5, the current flowing through the primary circuit of each of the transformers will at any time be identical.

Now, if a lamp should become deficient, i.e., burn out, causing the corresponding current transformer to become unloaded or uncoupled, the self-induction or inductance of that transformer will increase considerably above the inductance of a transformer loaded with an efficient or unburned lamp. For transformers of the type applicable for the purpose involved, the self-induction will thus be increased or multiplied by a factor ranging from, e.g., 50 to 100. However, this increase in self-induction will occur only in certain time intervals within a half period of the alternating current i flowing through the primary circuit of an unloaded transformer (and through those of the lamp loaded transformers). There are two of these time intervals within any half period, the first occurring when i rises from zero to $i = i_M$ the so-called saturation current of the transformer, and the second when i falls from $i_M$ to zero (see curves c and d of FIGS. 4 and 5 respectively). Although $i_M$ is a characteristic for each individual transformer, it is identical for identical transformers. Particularly, $i_M$ is the current sufficient to magnetically saturate the iron core of the relevant transformer.

In the time interval between the two intervals mentioned above, i rises from $i = i_M$ to $i_{max}$ and falls again therefrom to $i_M$. In this intermediate interval the iron core of the unloaded transformer will be saturated magnetically with the result that the selfinduction of the transformer in question in that time interval will no longer be 50 to 100 times the normal value, but almost zero. This means that in the intermediate time interval the unloaded transformer will provide only an ohmic, but practically no inductive, resistance to the current i passing through the loop circuit 5 including the primary circuits of both the unloaded transformer and the normally loaded transformers.

A comparison made between curves a, b, c, and d as shown in FIGS. 2–5 reveals that the presence of one or of more deficient lamps (with consequent drastic inductance changes for low values of i as explained above) will cause a change in the form of curves c and d as compared with curve b. The comparison also reveals that one or more deficient lamps will have another effect as well, namely, a displacement to the right between, on one hand, the voltage curve a and, on the other hand, the current curves b, c, and d.

More precisely, the greater the number of deficient lamps, i.e., the greater the number of unloaded transformers, the more flattened out the current curves become near the point where i is equal to zero and the greater the displacement.

Equation (5) can now be modified so as to account for the comments directly above. The integration to which the terms on both sides of the equation mark are subjected is now carried out between fixed values for t and i, namely between $t = t_o$ corresponding to $i = $ zero and $t = T$ corresponding to $i = i_M$, i.e., the saturation current referred to above. In the current interval $i = 0$ to $i = i_M$, none of the cores of the current transformers is saturated. If m lamps out of n are deficient the modified equation will read:

$$\int_{t_o}^{T} u\,dt = -m \int_{o}^{i_M} L_T di - (n - m) \int_{o}^{i_M} L_N di \quad (6)$$

wherein $L_T$ is the self-inductance of a current transformer having an unloaded secondary circuit and $L_N$ is the self-induction of a current transformer whose secondary circuit is loaded with a lamp.

Considering now $L_T$ and $L_N$ as being independent of i, which is permissible so long as i varies in the interval i=zero to i=$i_M$, equation (6) will read:

$$\int_{t_o}^{T} u\,dt = (-mL_T - (n - m)L_N) \int_{o}^{i_M} di \quad (7)$$

$$= - (mL_T + (n - m) L_N)i_M$$

Isolating m, equation (7) can be rewritten as follows:

$$m = 1/(L_N - L_T) i_M \left( \int_{t_o}^{T} u\,dt + ni_M L_N \right) \quad (8)$$

By inserting $1/(L_M - L_T)i_M = A$, and
$L_N n i_M = B$, the following important expression is derived from equation (8):

$$m = A \left( \int_{t_o}^{T} u\,dt + B \right) \quad (9)$$

This equation states that apart from a constant supplement B the number m of deficient lamps will at any time be proportional to the integral of the loop supply voltage u in the given interval, i.e., $t_o \leq t \leq T$. It should be noted that the equation (9) as derived holds good for any two indications of time $t_o$ and T provided that corresponding fixed values of i satisfy the condition $0 \leq i_{t_o} < i_T = i_M$. The values of A and B, however, will vary with the choice of $i_t$ and $i_T$. But since i=zero and i=$i_M$ are easily reproduceable, $t_o$ is preferably chosen to be the time when i rises from zero and T to be the time when i approaches the value $i_M$.

With reference to the FIGS. it will now be explained how the expression according to equation (9) is embodied in practice based on signals received from the voltage transformer 11 and current transformer 12 and how the electronic circuit identified by parts having reference numerals 13 to 23 inclusive in FIG. 1 is designed according to the invention.

An ohmic resistance 13, namely the one mentioned above, bridges the secondary terminals of current transformer 12 and serves to convert the secondary current from the transformer to a voltage proportional to that current and to current i in the loop circuit 5.

Low-pass filters 14 and 15 serve to remove undesired "foreign" frequencies, typically known as "noise", from the voltage curve representing the voltage across the secondary terminals of voltage transformer 11 and of current transformer 12 respectively.

Rectifiers 16 and 17 receive and rectify the respective voltages. A logic circuit 18 the function of which will be described in more detail below receives the rectified voltage signal from rectifier 17 and produces a control signal for controlling an integrator 19 also receiving the rectified voltage from rectifier 16.

A subtraction circuit 20 receives the integrated voltage signal from integrator 19 and also a voltage supplied from a potentiometer 21. An indicator 22, e.g., a pointer instrument, indicates how many, i.e., m, of the n lamps are not alight at any given time. The scale of indicator 22 may be graduated so that the pointer will indicate the number m directly, or the percentage m/n 100, of deficient lamps. Terminals 23 are also provided to which modified indicators may be coupled, e.g. an alarm capable of giving a visible warning such as a red lamp or an audible as in the case of a bell when the percentage of lamps not alight exceeds, e.g., 10 and possibly also a signal when the percentage exceeds, e.g., 20.

The operation of the indicating system or electronic circuit including circuits 13 through 21 inclusively is hereinafter described when m lamps out of n are deficient.

The voltage transformer 11 yields an AC voltage signal which at any time is proportional to the instantaneous value of the voltage u across terminals 9 and 10. After having been filtered in low pass filter 14 and rectified in rectifier 16, the voltage signal is applied to a first input of integrator 19.

In a similar manner, the current transformer 12 provides an AC current signal which at any time is proportional to the instantaneous value of current i flowing in loop circuit 5. Because of the bridging ohmic resistance 13, the AC current signal is converted into an AC voltage signal proportional thereto and to the loop current i. The voltage signal originating from current transformer 12 is subsequently filtered in low pass filter 15 and rectified in rectifier 17. Subsequently it is applied to logic circuit 18.

The logic circuit 18 comprises a conventional SR flip-flop (SR stands for "Set-Reset") actuated by two comparators, I and II, with corresponding potentiometers I' and II'.

Each comparator has two inputs and one output. The flip-flop has an output and two inputs, i.e., a "set"-input and a "reset"-input. The "set"-input is connected to the output of comparator I. The "reset"-input is connected to the output of comparator II. The output of the flip-flop is connected to a second input of integrator 19 which has two inputs and one output.

The output signal from rectifier 17 is applied in logic circuit 18 both to an input of comparator I and to the corresponding input of comparator II. Each of the two potentiometers I' and II' is capable of yielding a voltage which for potentiometer I' is of a value corresponding to i=zero and for potentiometer II' of a value corresponding to i=$i_M$. The voltage from potentiometer I' is applied to the available input of comparator I and the voltage from potentiometer II' is applied to the available input of comparator II.

In a logic circuit 18 as described above, the below described events take place within a half period of i and within subsequent half periods thereafter.

When current i in loop 5 passes the value zero (at time $t_o$) comparator I will be actuated so as to cause the flip-flop to be set and remain so until current i passes the value $i_M$ (at time T). When this happens comparator II will be actuated and cause the flip-flop to be reset and remain so while i increases from $i_M$ to $i_{max}$ and decreases from $i_{max}$ through $i_M$ down to i=zero. At that time, a new half period starts and the flip-flop will again be set, and so on. In other words, the flip-flop will be "high" (or "logic 1") in the first part of the half period from t=$t_o$ to t=T and will be "low" (or "logic 0") in the remaining part thereof, i.e., the output of the logic circuit 18 will yield a voltage pulse of a duration from t=$t_o$ to t=T in each half period and no pulse in the remaining part of the half period.

The said pulse, as indicated above, is applied to the second input of integrator 19 in which it is utilized to actuate an analog switch allowing the logic circuit 19 to integrate the output voltage from rectifier 16 between the limits $t_o$ and T, and to calculate the mean value thereof which becomes the output of 19. This output is an electrical signal produced in the electronic circuit so as to be proportional to the voltage integral $$\int_{t_o}^{T} u\,dt,$$

and from the above it is evident that this is so.

Referring once again to FIGS. 2–5, the operation described above can be discussed in accordance with a graphical representation of the occurrences in the electronic circuit, particularly in parts 18 and 19 thereof.

In the system of co-ordinates two characteristic ordinates belonging to current curve b are drawn and are extended upwardly so as to intersect the voltage curve a. One of these two ordinates passes through the point in which current curve b intersects the abscissa or time axis t. This point represents the time $t_o$ at which i is equal to zero. The other ordinate passes through the point in which curve b intersects a line parallel to and at a distance of $i=i_M$ above said axis. This point represents the time T at which $i=i_M$.

The two ordinates thus forming a pair are drawn at a distance 24 from each other in FIGS. 2 and 3 and constitute a time interval equal to T-$t_o$.

The voltage curve a together with the two ordinates described above in regard to FIGS. 2 and 3 and the time axis for curve a bound an area which is unhatched in FIG. 2.

Similar pairs of ordinates are drawn in current curves c and d, respectively, whereby two further areas arise in FIG. 2. One, based on ordinates originating from current curve c in FIG. 4, is hatched "down to the right", and the other, based on ordinates originating from current curve d in FIG. 5, is hatched "up to the right". The distances between the paired ordinates in the last two mentioned cases are designated 25 and 26, respectively.

Each of the three areas is proportional to $$\int_{t_o}^{T} u\,dt$$

whether based on curve a, b, c, and d. But the values of $t_o$ and T will be different in the three cases. With respect to curve b in FIG. 3, $t_o$ is the time when i is zero and T is the time when $i=i_M$, the i-values being taken from curve b representing the situation when all lamps are alight. In this case, the area in FIG. 2 between the respective ordinate pairs is unhatched. In regard to curve c in FIG. 4, the i-values are taken from curve c representing the situation when a certain number m of the lamps are not alight. The corresponding area in FIG. 2 is hatched "down to the right". Finally, with respect to curve d in FIG. 5, the i-values are taken from curve d representing the situation when double the number, i.e. 2m, compared to curve c are not alight. In this instance, the corresponding area is hatched "up to the right".

In view of the above, it is evident that the voltage $$\int_{t_o}^{T} u\,dt$$

is represented graphically as an area and that this area is proportional to the output of integrator 19 controlled as described hereinabove.

The output of 19 as the electrical signal produced in the electronic circuit is the constant, simple arithmetic mean voltage resulting from the "smoothing out" performed in integrator 19 for a given value of m, the number of deficient lamps.

Although this number m is not proportional to the "electrical signal", the relationship between them is given by equation (9) which reads:

$$m = A \left( \int_{t_o}^{T} u\,dt + B \right) \quad (9)$$

wherein A and B are constants as long as $t_o$ and T are kept constant and $0 \leq i \leq i_M$.

If m equals zero, i.e., if all the lamps are alight, the final output signal to be applied to the indicator 22 should be zero. From equation (9), it follows that in such case B must be equal to $$- \int_{t_o\;m=0}^{T} u\,dt.$$

If m is greater than zero, equation (9) may be rewritten as follows by inserting therein the value for B determined directly above.

$$m = A \left( \int_{t_o\;m=m}^{T} u\,dt - \int_{t_o\;m=0}^{T} u\,dt \right) \quad (10)$$

wherein the first integral varies with m, whereas the second integral is constant and corresponds to m=zero. This means that a fixed voltage, the compensation voltage, must be subtracted in subtraction circuit 20 from $$\int_{t_o\;m=m}^{T} u\,dt$$

such that indicator proper 22 will indicate the true number m of deficient lamps.

$$B = - \int_{t_o\;m=0}^{T} u\,dt$$

is represented by the unhatched area discussed in connection with curve a of FIG. 2 and its presence in equations (9) and (10) is due to the fact that even when all lamps are alight (m=0) there would be some inductance in the loop 5. This inductance would give rise to a certain deflection of the pointer of the indicator proper 22, if this were connected directly to integrator 19. If m lamps were deficient, the deflection corresponding to m=0 would be added to the deflection corresponding to m deficient lamps. Hence, it is necessary to subtract from the electrical output signal produced by integrator 19 a compensation voltage equal to $$\int_{t_0}^{T}{}_{m=0}\, udt.$$

This subtraction is performed in the subtraction circuit 20.

For this purpose, a potentiometer 21 is provided from which a DC compensation voltage is applied to subtraction circuit 20. Therein it is subtracted from the output signal, so that a voltage equal to $$A\left(\int_{t_0\, m=m}^{T} udt - \int_{t_0\, m=0}^{T} udt\right)$$

is available at the output of subtraction circuit 20.

The proper value of the voltage to be yielded by potentiometer 21 may be calculated from the equation $$B = \int_{t_0\, m=0}^{T} udt$$

but it is more easy and more exact to adjust the potentiometer experimentally when the whole plant is installed ready for use in the following manner.

The indicator proper 22 is connected electrically to the output terminals of subtraction circuit 20 and it is ascertained that all n lamps involved are alight, i.e. m=zero. In these circumstances the pointer of indicator 22 should be at zero, but no doubt it will be deflected because potentiometer 21 is adjusted casually. The knob of 21 is now turned or displaced slowly in such direction as to cause the deflection of 21 to decrease. The movement of the knob is continued until the pointer just reaches zero. The corresponding adjustment of 21 is the proper one, i.e. the proper voltage will be subtracted in 20.

By the way, the graduation of the equidistant scale on the indicator proper 22 is made in a corresponding way after adjustment of potentiometer 21 once and for all, one lamp is removed causing the pointer to deflect to a certain point on the scale. That point is marked 1. Then another lamp is removed causing the pointer to make an additional deflection. The point thus arrived at is marked 2, and so forth.

I claim:

1. A device for detecting variation in the loading of a circuit coupled to an alternating current source, the circuit being loaded by a plurality of serially interconnected primary circuits of a like plurality of loading transformers having a like plurality of secondary circuits, each secondary circuit being coupled to a respective primary circuit, comprising current signal means for generating a current signal representative of the current flowing in the loaded circuit, voltage signal means for generating a voltage signal representative of the voltage supplied to the loaded circuit, detection means responsive to said current signal and said voltage signal for generating an output voltage signal proportional to the integration of the voltage supplied to the loaded circuit, said integration being from a first predetermined time corresponding to a first circuit current value of approximately zero and a second predetermined time corresponding to a second circuit current value approximately equal to the saturation current for the loading transformers, said output voltage signal being indicative of the number of primary circuits of the loading transformers being uncoupled to their respective secondary circuits.

2. The device according to claim 1 wherein said detection means is an electronic circuit comprising:
   a. first low pass filter means coupled to said voltage signal means for generating a first generally noise-free signal; and
   b. first rectifier means for rectifying said first noise-free signal so as to generate a first rectified signal representative of the voltage supplied to the loaded circuit.

3. The device according to claim 2 wherein said electronic circuit further comprises:
   a. resistance means coupled to said current signal means for generating a voltage signal corresponding to the current flowing in the circuit;
   b. second low pass filter means coupled to said resistance means for generating a second generally noise-free signal; and
   c. second rectifier means for rectifying said second noise-free signal so as to generate a second rectified signal representative of the current flowing in the loaded circuit.

4. The device according to claim 3 wherein said electronic circuit further comprises logic circuit means for receiving said second rectified signal and for generating a control signal, said control signal having a first state value when the current flowing in the loop circuit is increasing in magnitude and exceeds a current value of zero, and said control signal having a second state value when said current flowing in the loop circuit exceeds said saturation value.

5. The device according to claim 4 wherein said electronic circuit further comprises integration means for receiving said first rectified signal and for receiving said control signal so as to integrate said first rectified signal during the time interval occurring between the first state and the second state value and the second state value of said control signal and to generate an integrated output signal.

6. The device according to claim 5 wherein said electronic circuit comprises a compensating means for receiving said integrated output signal and generating a compensation signal so as to generate a final output voltage signal being indicative of the number of primary circuits of the loading transformers being uncoupled to their respective secondary circuits.

7. The device according to claim 6 further comprising indicating means for receiving said final output signal and providing a display of the number of uncoupled primary circuits.

8. The device according to claim 7 wherein said indicating means comprises a voltage meter.

9. The device according to claim 8 wherein said voltage meter is precalibrated so as to provide a numerical display of the number of uncoupled primary circuits.

10. The device according to claim 1 wherein said voltage signal means comprises transformer means coupled to the alternating current source.

11. The device according to claim 1 wherein said current signal means comprises a transformer coupled to the alternating current source.

12. The device according to claim 1 wherein said secondary circuits are each coupled to an airfield lighting lamp.

13. In a plant for supplying electric current from an alternating current source to a loop circuit comprising the series interconnected primary circuits of a number n of current transformers, an indicating device for indicating the number $m<n$ of those of the said transformers which at the given moment may have unloaded secondary circuits, the indicator proper of said indicating device being actuated by an electric signal produced in an electronic circuit in dependence of the loop current i and the loop supply voltage u across the terminals of the alternating current source, characterised in that the electronic circuit comprises means capable of making the said electric signal proportional to the voltage integral $$\int_{t_o}^{T} u\,dt$$

of the loop supply voltage u from the time $t_o$ when the loop current i in each half period passes the zero value and to the time T when the loop current i attains a value corresponding to the saturation current $i_M$ for the current transformers, the means for producing and subtracting from the said electric signal a compensation voltage representing the value of said voltage integral in case none of the current transformers has unloaded secondary circuits, so as to obtain a final voltage signal to be passed on to the indicator proper.

14. A method for detecting variation in the loading of a circuit coupled to an alternating current source, the circuit being loaded by a plurality of serially interconnected primary circuits of a like plurality of loading transformers having a like plurality of secondary circuits, each secondary circuit being coupled to a respective primary circuit, comprising generating a current signal representative of the current flowing in the loaded circuit, generating a voltage signal representative of the voltage supplied to the loaded circuit, generating an output voltage signal in response to said current signal and said voltage signal, said output voltage signal being proportional to the integration of the voltage supplied to the loaded circuit, said integration being from a first predetermined time corresponding to a first circuit current value of approximately zero and a second predetermined time corresponding to a second circuit current value approximately equal to the saturation current for the loading transformers, said output voltage signal being indicative of the number of primary circuits of the loading transformers being uncoupled to their respective secondary circuits.

* * * * *

UNITED STATES PATENT AND TRADEMARK OFFICE
CERTIFICATE OF CORRECTION

PATENT NO. : 4,323,841
DATED : April 6, 1982
INVENTOR(S) : Leif V. Jacobsen

It is certified that error appears in the above-identified patent and that said Letters Patent are hereby corrected as shown below:

In Column 5, line 60, should continue as

-- as compared to the first term (-L di/dt).
This is so small because C and R are small.
With respect to i, it is itself small in
periods where L is big, viz. when i varies
between zero and the saturation value --.

Signed and Sealed this

Seventh Day of September 1982

|SEAL|

Attest:

Attesting Officer

GERALD J. MOSSINGHOFF

Commissioner of Patents and Trademarks